(12) United States Patent
Dong (10) Patent No.: US 8,507,300 B2
(45) Date of Patent: Aug. 13, 2013

(54) LIGHT-EMITTING DIODE WITH LIGHT-CONVERSION LAYER

(75) Inventor: Yi Dong, Tracy, CA (US)

(73) Assignee: LedEngin, Inc., San Jose, CA (US)

( * ) Notice: Subject to any disclaimer, the term of this patent is extended or adjusted under 35 U.S.C. 154(b) by 935 days.

(21) Appl. No.: 12/344,158

(22) Filed: Dec. 24, 2008

(65) Prior Publication Data

US 2010/0155755 A1  Jun. 24, 2010

(51) Int. Cl.
 *H01L 21/02* (2006.01)
(52) U.S. Cl.
 USPC .. 438/29; 438/35; 257/E21.002; 257/E31.129
(58) Field of Classification Search
 USPC ............... 438/29, 35; 257/E21.002, E31.129
 See application file for complete search history.

(56) References Cited

U.S. PATENT DOCUMENTS

| | | | |
|---|---|---|---|
| 5,742,120 A | 4/1998 | Lin | |
| 5,959,316 A | 9/1999 | Lowery | |
| 6,307,160 B1 | 10/2001 | Mei et al. | |
| 6,351,069 B1 | 2/2002 | Lowery et al. | |
| 6,608,332 B2 | 8/2003 | Shimizu et al. | |
| 6,610,563 B1 | 8/2003 | Waitl et al. | |
| 6,614,179 B1 | 9/2003 | Shimizu et al. | |
| 6,642,652 B2 | 11/2003 | Collins, III et al. | |
| 6,653,661 B2 | 11/2003 | Okazaki | |
| 6,680,128 B2 | 1/2004 | Mei | |
| 6,791,116 B2 | 9/2004 | Takahashi et al. | |
| 6,828,170 B2 | 12/2004 | Roberts et al. | |
| 6,833,565 B2 | 12/2004 | Su et al. | |
| 6,835,960 B2 | 12/2004 | Lin et al. | |
| 6,841,933 B2 | 1/2005 | Yamanaka et al. | |
| 6,870,311 B2 | 3/2005 | Mueller et al. | |
| 7,045,375 B1 | 5/2006 | Wu et al. | |
| 7,064,353 B2 | 6/2006 | Bhat | |
| 7,066,623 B2 | 6/2006 | Lee et al. | |
| 7,156,538 B2 | 1/2007 | Han et al. | |

(Continued)

FOREIGN PATENT DOCUMENTS

| | | |
|---|---|---|
| JP | H9-321341 A | 12/1997 |
| JP | H11-298035 A | 10/1999 |

(Continued)

OTHER PUBLICATIONS

Kading, O.W., "Thermal Conduction in Metallized Silicon-Dioxide Layers on Silicon," Applied Physics, Sep. 1994, vol. 65, No. 13, pp. 1629-1631.

(Continued)

*Primary Examiner* — Thanh Nguyen
(74) *Attorney, Agent, or Firm* — Kilpatrick Townsend & Stockton LLP (57) ABSTRACT

A method for making a lighting apparatus includes providing a substrate and disposing a light-emitting diode overlying the substrate. The light-emitting diode has a top surface oriented away from the substrate and a plurality of side surfaces. A light-conversion material is provided that includes a substantially transparent base material and a wave-shifting material dispersed in the base material. The concentration of the wave-shifting material can be at least 30%. In an embodiment, the concentration of the wave-shifting material can be approximately 50% or 70%. A predetermined amount of the light-conversion material is deposited on the top surface of the light-emitting diode while the side surfaces are maintained substantially free of the light-conversion material.

5 Claims, 8 Drawing Sheets

(56) References Cited

U.S. PATENT DOCUMENTS

| | | | |
|---|---|---|---|
| 7,157,744 B2 | 1/2007 | Palmteer et al. | |
| 7,168,608 B2 | 1/2007 | Mei | |
| 7,199,446 B1 | 4/2007 | Mei et al. | |
| 7,264,378 B2 | 9/2007 | Loh | |
| 7,280,288 B2 | 10/2007 | Loh et al. | |
| 7,473,933 B2 | 1/2009 | Yan | |
| 7,497,608 B2 | 3/2009 | Wheatley et al. | |
| 7,646,035 B2 | 1/2010 | Loh et al. | |
| 7,670,872 B2 | 3/2010 | Yan | |
| 7,772,609 B2 | 8/2010 | Yan | |
| 7,985,000 B2 | 7/2011 | Dong | |
| 8,134,292 B2 | 3/2012 | Yan | |
| 2001/0015778 A1 | 8/2001 | Murade | |
| 2002/0015013 A1 | 2/2002 | Ragle | |
| 2002/0079837 A1 | 6/2002 | Okazaki | |
| 2002/0163006 A1 | 11/2002 | Yoganandan et al. | |
| 2002/0191885 A1 | 12/2002 | Wu et al. | |
| 2003/0016899 A1 | 1/2003 | Yan | |
| 2003/0086674 A1 | 5/2003 | Yan et al. | |
| 2003/0095399 A1 | 5/2003 | Grenda et al. | |
| 2003/0116769 A1 | 6/2003 | Song et al. | |
| 2003/0122482 A1 | 7/2003 | Yamanaka et al. | |
| 2003/0214233 A1* | 11/2003 | Takahashi et al. | 313/512 |
| 2003/0227249 A1 | 12/2003 | Mueller et al. | |
| 2003/0230977 A1 | 12/2003 | Epstein | |
| 2004/0004437 A1 | 1/2004 | Shimizu et al. | |
| 2004/0036081 A1 | 2/2004 | Okazaki | |
| 2004/0051111 A1 | 3/2004 | Ota et al. | |
| 2004/0079957 A1 | 4/2004 | Andrews et al. | |
| 2004/0084687 A1 | 5/2004 | Hohn et al. | |
| 2004/0102061 A1 | 5/2004 | Watanabe | |
| 2004/0126918 A1 | 7/2004 | Kurahashi et al. | |
| 2004/0129946 A1 | 7/2004 | Nagai et al. | |
| 2004/0173810 A1 | 9/2004 | Lin et al. | |
| 2004/0188697 A1 | 9/2004 | Brunner et al. | |
| 2004/0201025 A1 | 10/2004 | Barnett et al. | |
| 2004/0207998 A1 | 10/2004 | Suehiro et al. | |
| 2004/0257496 A1 | 12/2004 | Sonoda | |
| 2005/0035364 A1 | 2/2005 | Sano et al. | |
| 2005/0062140 A1* | 3/2005 | Leung et al. | 257/678 |
| 2005/0093146 A1 | 5/2005 | Sakano | |
| 2005/0145872 A1 | 7/2005 | Fang et al. | |
| 2005/0179376 A1 | 8/2005 | Fung et al. | |
| 2005/0199900 A1 | 9/2005 | Lin et al. | |
| 2005/0221519 A1* | 10/2005 | Leung et al. | 438/27 |
| 2005/0224829 A1 | 10/2005 | Negley et al. | |
| 2005/0224830 A1 | 10/2005 | Blonder et al. | |
| 2005/0253242 A1 | 11/2005 | Costello et al. | |
| 2005/0270666 A1 | 12/2005 | Loh et al. | |
| 2005/0286131 A1 | 12/2005 | Saxena et al. | |
| 2006/0012299 A1 | 1/2006 | Suehiro et al. | |
| 2006/0063287 A1 | 3/2006 | Andrews | |
| 2006/0082296 A1 | 4/2006 | Chua et al. | |
| 2006/0082679 A1 | 4/2006 | Chua et al. | |
| 2006/0091788 A1 | 5/2006 | Yan | |
| 2006/0097385 A1 | 5/2006 | Negley | |
| 2006/0102914 A1 | 5/2006 | Smits et al. | |
| 2006/0105484 A1 | 5/2006 | Basin et al. | |
| 2006/0105485 A1 | 5/2006 | Basin et al. | |
| 2006/0124953 A1* | 6/2006 | Negley et al. | 257/99 |
| 2006/0170332 A1 | 8/2006 | Tamaki et al. | |
| 2006/0226758 A1* | 10/2006 | Sofue et al. | 313/483 |
| 2006/0284209 A1 | 12/2006 | Kim et al. | |
| 2006/0289050 A1 | 12/2006 | Alley et al. | |
| 2007/0090375 A1 | 4/2007 | Kobilke | |
| 2007/0194341 A1* | 8/2007 | Chang et al. | 257/99 |
| 2007/0215893 A1 | 9/2007 | Liao et al. | |
| 2007/0223219 A1* | 9/2007 | Medendorp et al. | 362/231 |
| 2007/0228390 A1 | 10/2007 | Hattori et al. | |
| 2007/0274098 A1 | 11/2007 | Wheatley et al. | |
| 2007/0278512 A1 | 12/2007 | Loh et al. | |
| 2008/0012036 A1 | 1/2008 | Loh et al. | |
| 2008/0048200 A1 | 2/2008 | Mueller et al. | |
| 2008/0308825 A1 | 12/2008 | Chakraborty et al. | |
| 2009/0001390 A1 | 1/2009 | Yan et al. | |
| 2009/0015138 A1* | 1/2009 | Daicho et al. | 313/503 |
| 2009/0021140 A1* | 1/2009 | Takasu et al. | 313/502 |
| 2009/0286337 A1* | 11/2009 | Lee et al. | 438/27 |
| 2010/0091499 A1 | 4/2010 | Jiang et al. | |

FOREIGN PATENT DOCUMENTS

| | | |
|---|---|---|
| JP | 2000-349346 | 12/2000 |
| JP | 2000-349347 | 12/2000 |
| JP | 2001-057445 | 2/2001 |
| JP | 2001-168398 A | 6/2001 |
| JP | 2002-185046 | 6/2002 |
| JP | 2004-031508 A | 1/2004 |
| JP | 2004-111937 A | 4/2004 |
| JP | 2004-241704 | 8/2004 |
| JP | 2004-253404 | 9/2004 |
| JP | 2004-259958 A | 9/2004 |
| JP | 2004-266246 A | 9/2004 |
| JP | 2004-274087 A | 9/2004 |
| JP | 2004-282004 A | 10/2004 |

OTHER PUBLICATIONS

Official Action for Japanese Patent Application No. 2005-315149, dated Jul. 21, 2009, 3 pages total.

"Solvent Soluble Polyimide with High Transparency and High Tg: HOP-400, 500," Hitachi Cable Review, Aug. 2003, No. 22, p. 78.

Yan, Xiantao, "Two Test Specimens for Determining the Interfacial Fracture Toughness in Flip-Chip Assemblies," Jun. 1998, Transactions of the ASME, vol. 120, pp. 150-155.

Yan, Xiantao, "Analysis Based Design Guidelines for Metal Runner and Passivation Layers in IC Packaging," DELPHI Automotive Systems, Analytical Engineering Conference, May 2000, pp. 1-4.

International Search Report and Written Opinion of PCT Application No. PCT/US2009/069070, dated Mar. 1, 2010, 9 pages total.

Non-Final Office Action for U.S. Appl. No. 11/036,559, mailed on Aug. 18, 2009, 15 pages.

Non-Final Office Action for U.S. Appl. No. 11/036,559, mailed on Feb. 3, 2009, 8 pages.

Non-Final Office Action for U.S. Appl. No. 11/036,559, mailed on Sep. 16, 2008, 14 pages.

Final Office Action for U.S. Appl. No. 11/036,559, mailed on May 15, 2008, 17 pages.

Requirement for Restriction/Election for U.S. Appl. No. 11/036,559, mailed on Sep. 19, 2007, 11 pages.

Requirement for Restriction/Election for U.S. Appl. No. 11/036,559, mailed on Aug. 30, 2007, 5 pages.

Requirement for Restriction/Election for U.S. Appl. No. 11/036,559, mailed on Jun. 5, 2007, 5 pages.

Final Office Action for U.S. Appl. No. 11/036,559, mailed on Jun. 7, 2010, 11 pages.

Notice of Allowance for U.S. Appl. No. 12/420,800, mailed on May 6, 2011, 2 pages.

Notice of Allowance for U.S. Appl. No. 12/420,800, mailed on Mar. 22, 2011, 8 pages.

Non-Final Office Action for U.S. Appl. No. 11/036,559, mailed on Apr. 12, 2011, 12 pages.

Non-Final Office Action for U.S. Appl. No. 12/420,800, mailed on Sep. 28, 2010, 11 pages.

Harper, Charles A., Electronic Materials and Processes Handbook, 2004, The McGraw-Hill Companies, Third Edition, p. 2.39.

Notice of Allowance for U.S. Appl. No. 11/036,559, mailed on Jan. 23, 2012, 7 pages.

Notice of Allowance for U.S. Appl. No. 11/036,559, mailed on Sep. 9, 2011, 5 pages.

Non-Final Office Action for U.S. Appl. No. 11/036,559, mailed on Apr. 12, 2011, 11 pages.

* cited by examiner

LIGHT-EMITTING DIODE WITH LIGHT-CONVERSION LAYER

CROSS-REFERENCES TO RELATED APPLICATIONS

The application is related to U.S. patent application Ser. No. 11/036,559, filed on Jan. 13, 2005 and entitled "Light Emitting Device with a Thermal Insulating and Refractive Index Matching Material," which is commonly owned and incorporated by reference herein.

FIELD OF THE INVENTION

The present invention relates generally to lighting apparatus and more particularly to methods and apparatus for providing enhanced brightness and stability in light sources based on light-emitting diodes (LEDs).

BACKGROUND OF THE INVENTION

A light emitting diode (LED) is a semiconductor device that produces light when an electric current is passed therethrough. LEDs have many advantages over conventional lighting sources, including compact size, low weight, longer life time, high vibration resistance, and higher reliability. In addition to having widespread applications for electronic products as indicator lights, LEDs also have become an important alternative light source for various applications where incandescent and fluorescent lamps have traditionally predominated.

Additionally, wider applicability of LEDs has been made possible through the use of phosphors in conjunction with LEDs. A phosphor is a luminescent material that, when excited by a light of a certain wavelength, produces a light at a different wavelength, thus modifying the output light of the LED. Accordingly, where a particular color is desired and that color cannot be produced by available LEDs cost effectively, phosphors can be used as light "converters" to alter the color of the light produced by an available LED to the desired color.

For example, phosphors are now used with monochromatic LEDs to produce white light. Using phosphors to convert the light produced by an LED to white light has proven to be a viable alternative to conventional white light sources, including incandescent light sources and the direct red-green-blue (RGB) LED methods in which multiple monochromatic LEDs are combined in a RGB scheme to produce white light.

In a typical LED-based white light producing device, a monochromatic LED is encapsulated by a transparent material containing appropriate compensatory phosphors. The wavelength(s) of the light emitted from the compensatory phosphor is compensatory to the wavelength of the light emitted by the LED such that the wavelengths from the LED and the compensatory phosphor mix together to produce white light. For instance, a blue LED-based white light source produces white light by using a blue light LED and a phosphor that emits a yellowish light when excited by the blue light emitted from the LED. In these devices the amount of the phosphor in the transparent material is carefully controlled such that only a fraction of the blue light is absorbed by the phosphor while the remainder passes unabsorbed. The yellowish light and the unabsorbed blue light mix to produce white light.

Another exemplary scheme uses an LED that produces light outside of the visible spectrum, such as ultraviolet (UV) light, together with a mixture of phosphors capable of producing either red, green, or blue light when excited. In this scheme, the light emitted by the LED only serves to excite the phosphors and does not contribute to the final color balance.

As demand for better lighting devices continues to increase, it would be desirable to provide cost-effective LED-based lighting sources having improved efficiency and brightness.

BRIEF SUMMARY OF THE INVENTION

Even though conventional LED-based white light sources have found wide application, they suffer from many limitations. One common problem is that conventional LED-based white light sources suffer from thermal instability of the phosphor and often do not provide sufficient and reliable brightness. As described in more detail below, conventional LED-based lighting devices tend to degrade as the devices heat up, and thermal management problems worsen with high power LEDs that are increasingly in demand.

In various embodiments, the present invention provides methods and devices in which light-conversion material is present only on the top surface of an LED die, leaving the side surfaces of the LED substantially free from the light-conversion material. In an embodiment, the method includes using a syringe or a similar device to deposit a small amount of viscous light-conversion material that includes a high concentration of wave-shifting material, such as phosphor. This deposition method allows a high concentration of large phosphor particles in the light-conversion material. Moreover, the phosphor particles can settle and be disposed close to the LED die, and the temperature of the phosphor can be controlled by the heat sink associated with the LED die. As a result, light apparatus providing brighter, more stable, and more uniform light can be made at reduced cost.

Even though the invention has been applied to LED-based white light sources, it would be recognized that the invention has a much broader range of applicability. For example, various combinations of phosphor and light source having different colors can be used to produce a substantially uniform light of a desired color or a combination of light having multiple colors.

According to an embodiment of the present invention, a method for making a lighting apparatus includes providing a substrate and disposing a light-emitting diode overlying the substrate. The light-emitting diode has a top surface oriented away from the substrate and a plurality of side surfaces. A light-conversion material is provided that includes a substantially transparent base material and a wave-shifting material dispersed in the base material. The concentration of the wave-shifting material can be at least 30%. In an embodiment, the concentration of the wave-shifting material can be approximately 50%. A predetermined amount of the light-conversion material is deposited on the top surface of the light-emitting diode while the side surfaces are maintained substantially free of the light-conversion material.

In a specific embodiment of the above method, the wave-shifting material is allowed to settle to a bottom portion of the light-conversion material on the top surface of the light-emitting diode, thus forming a uniform layer of wave-shifting material overlying the top surface of the LED. In an embodiment, the substrate has a recess in a front side of the substrate, and the light-emitting diode is disposed in the recess. In a specific embodiment, the wave-shifting material comprises particles having an average diameter of 2 µm or larger. In some embodiments, the light-conversion material is deposited using a syringe or a needle. In certain embodiments, the method also includes subjecting the substrate, the light-emitting diode, and the light-conversion material to a curing process.

In another embodiment of the present invention, a method for making a lighting apparatus includes providing a substrate and disposing a light-emitting diode overlying the substrate. The light-emitting diode has a top surface oriented away from the substrate and a plurality of side surfaces. The method includes providing a phosphor-containing material having phosphor particles dispersed in a transparent base material with a phosphor concentration of at least 30%. A predetermined amount of the phosphor-containing material is deposited on the top surface of the light-emitting diode while maintaining the side surfaces substantially free of the phosphor-containing material. Depending on the embodiment, the substrate can have one or more recesses. In an embodiment, the substrate has a recess in a front side thereof and the light-emitting diode is disposed in the recess. In some embodiments, the substrate can have multiple recesses and each recess can have one or more light-emitting diodes disposed therein. The phosphor-containing material can be deposited on each light-emitting diode either sequentially or in parallel.

In an alternative embodiment of the present invention, a method is provided for making a lighting apparatus having different light-emitting diodes and different phosphor-containing materials. The method includes providing a substrate having a recess in a front side of the substrate and disposing at least a first light-emitting diode and a second light-emitting diode in the recess. Each of the these light-emitting diodes has a top surface oriented away from the substrate and a plurality of side surfaces. The method also includes providing a first phosphor-containing material having a phosphor concentration of at least 30% and providing a second phosphor-containing material having a phosphor concentration of at least 30%. The first predetermined amount of the first phosphor-containing material is deposited on the top surface of the first light-emitting diode while the side surfaces are substantially free of the phosphor-containing material. A second predetermined amount of the second phosphor-containing material is deposited on the top surface of the second light-emitting diode while the side surfaces are substantially free of the phosphor-containing material.

In yet another embodiment of the present invention, a lighting apparatus includes a light-emitting diode having a top surface capable of emitting light and a plurality of side surfaces. In an embodiment, the light-emitting diode is configured such that during operation substantially no light is emitted from the side surfaces thereof. The lighting apparatus also includes a light-conversion layer overlying the top surface of the LED, whereas the side surfaces of the LED are substantially free of the light-conversion layer. The light-conversion layer has a substantially transparent base material and a wave-shifting material. In a specific embodiment, the concentration of the wave-shifting material is at least 30%. In another embodiment, the concentration of the wave-shifting material can be approximately 50% or 70%.

In an embodiment of the above lighting apparatus, the light-conversion layer is configured such that the lighting apparatus provides substantially uniform white light. In an embodiment, the wave-shifting material includes particles having an average diameter of 2 μm or larger. In a specific embodiment, the wave-shifting material is located substantially in a bottom portion of the light-conversion material on the top surface of the light-emitting diode.

Various additional objects, features, and advantages of the present invention can be more fully appreciated with reference to the detailed description and accompanying drawings that follow.

DETAILED DESCRIPTION OF THE INVENTION

In embodiments of the invention, various methods are provided for forming a lighting apparatus having a light-conversion layer. In a specific application, such a light-conversion layer can be used with a blue LED to produce uniform white light with improved brightness and uniformity and reduced cost compared to conventional devices. But it will be recognized that the invention has a much broader range of applicability.

Figure 1:
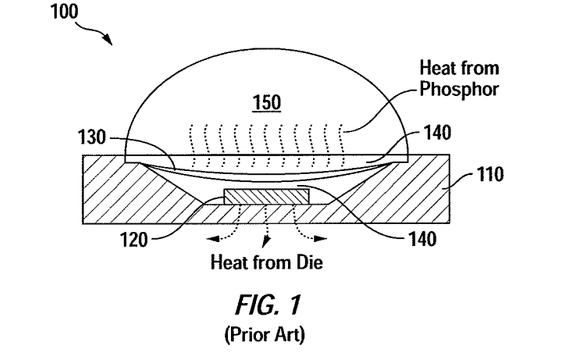
FIG. 1 is a simplified cross-sectional view of a conventional LED-based light emitting device.

Before embodiments of the present invention are described in detail below, certain limitations of conventional white light LED devices are first analyzed. FIG. 1 is a simplified cross-sectional view of a conventional LED-based light emitting device. As shown, light emitting device 100 has an LED 120 mounted on a substrate 110. LED 120 is disposed at the bottom of a cavity in substrate 110 and is encapsulated by a phosphor-containing layer 130 and insulating materials 140, which substantially fill the cavity. A lens 150 is provided on top of the insulating materials 130. In some devices, a heat sink (not shown) is also included in or attached to the substrate.

Although finding increasingly wider applications, conventional devices suffer from many limitations. In phosphor packaged white LEDs, one of the limitations is thermal stability and reliability of the phosphor. It is known that phosphors can convert blue or UV light to green, yellow, and red light. However, the conversion efficiency is lower than 100%, and some of the blue or UV light absorbed by the phosphor is converted to heat. Consequently, phosphors heat up during LED operation. In conventional devices, phosphor particles are uniformly dispersed in thick silicone, which is a good thermal insulator. As can be seen in FIG. 1, the heat in LED die 120 can be dissipated through the substrate or an attached heat sink. However, the temperature of phosphor-containing layer 130 can continue to rise. In high-power LEDs, this problem is even more serious.

Figure 2A:
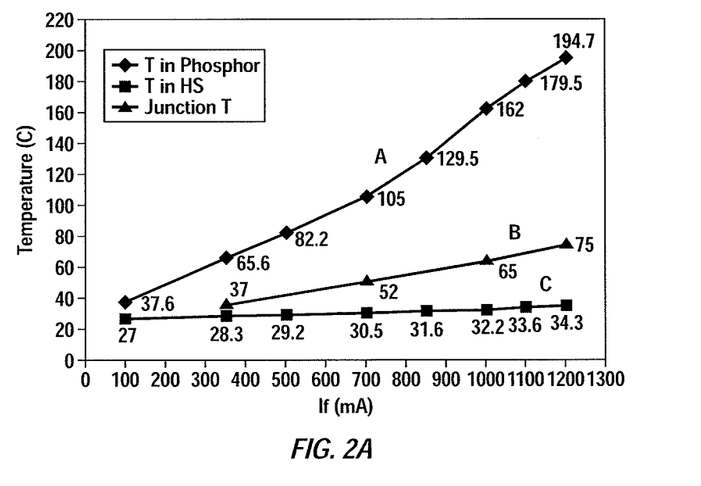
FIG. 2A is a graph illustrating a relationship between device temperature and LED current and FIG. 2B is a simplified diagram identifying various parts of a conventional LED-based light emitting device.
Figure 2B:
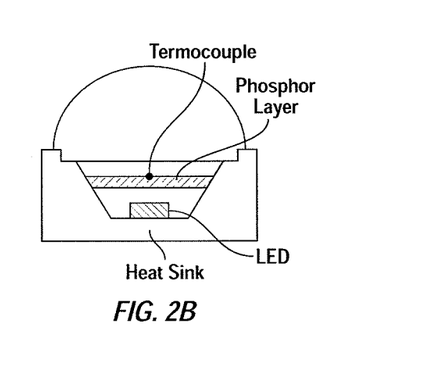

FIG. 2A is a graph illustrating a relationship between device temperature (in ° C.) and LED current If in milliamps (mA) in various parts of a conventional LED-based light emitting device. As shown in the cross-sectional view in FIG. 2B, the device includes a phosphor layer sandwiched by insulating materials, similar to FIG. 1. A thermocouple is used to measure various parts of the device at different LED currents. As shown in FIG. 2A, the heat sink temperature ("T in HS" shown as line C) is substantially maintained in a range close to 30° C. over a broad range of LED currents, whereas the temperature in the LED device ("Junction T" shown as line B) rises with increasing LED current. More important, the temperature of the phosphor layer ("T in Phosphor" shown as line A) rises to almost 200° C. as the LED current is increased to about 1200 mA.

Figure 3:
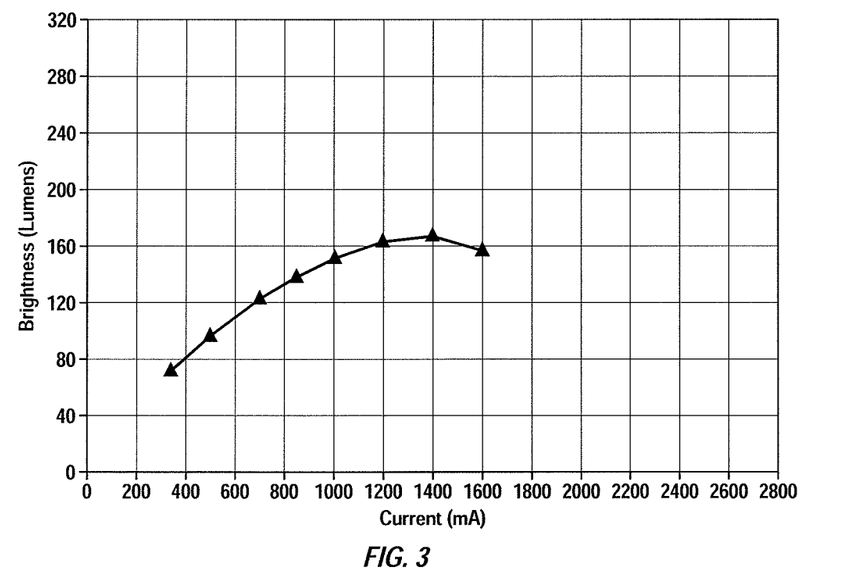
FIG. 3 is a graph illustrating brightness degradation with increasing LED current in a conventional LED-based light emitting device.

As phosphor is heated up to such high temperatures, its conversion efficiency decreases. The degradation of phosphor under heat can cause serious problems, such as brightness saturation, color shift, low luminance efficiency, and short life-time. FIG. 3 is a graph illustrating brightness degradation with increasing LED current in a conventional LED-based light-emitting device. As shown, when the LED current reaches about 1200 mA, the brightness reaches a plateau and starts to decrease with further increase in LED current. That is, operating the LED at higher current may not produce brighter light. This limitation is becoming increasingly important as demand continues to rise for brighter light sources based on high-power LEDs with power ratings of, e.g., 5 W to 10 W, or even higher.

Figure 4A:
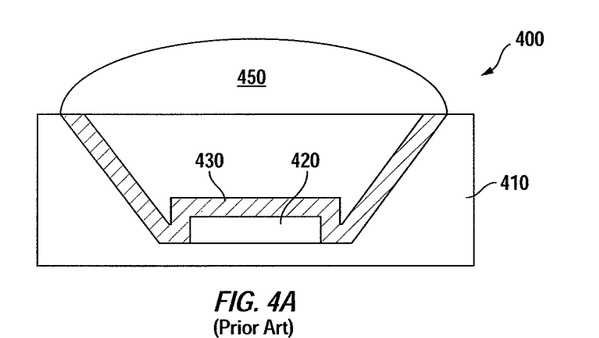
FIGS. 4A and 4B are simplified diagrams illustrating examples of alternative conventional LED-based light emitting devices.
Figure 4B:
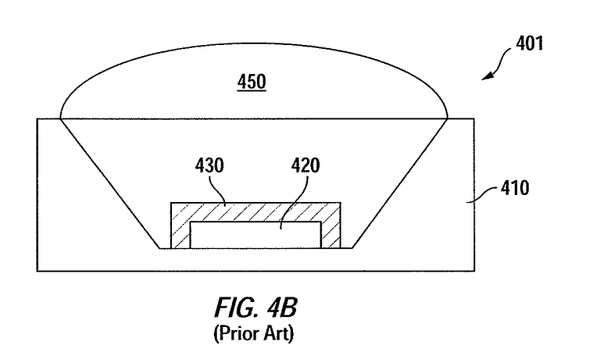

Conventional LED-based light devices also suffer from other limitations. FIGS. 4A and 4B are simplified diagrams illustrating examples of alternative conventional LED-based light-emitting devices. In conventional light-emitting devices 400 and 401 as shown in FIGS. 4A and 4B, LED 420 is mounted on a substrate 410 and encapsulated by a conformal phosphor-containing layer 430. In these conventional devices, phosphor-containing layer 430 is often formed by slurry deposition or conformal coating methods such as electro-plating. These methods require very fine phosphor particles, e.g., about 1 μm in diameter, to be uniformly dispersed in a base material, such as silicone. The small size of the phosphor particles tends to limit the brightness of light converted in the phosphor. Moreover, the conventional methods often coat the phosphor-containing material over the whole surface of die and, in certain cases, the substrate. As a result, conventional methods can consume a substantial amount of phosphor and increase the cost of LED-based lighting devices. Additionally, conventional methods often produce uneven coating of the phosphor material over the LED, resulting in non-uniform color and intensity distribution. For example, some conventional devices exhibit a ring of yellowish light surrounding white light in the center region.

As described above, conventional techniques for LED-based devices are subject to many limitations, including high cost, low brightness, non-uniform light distribution, and lack of stability and reliability. Accordingly, it would be desirable to provide LED-based lighting apparatus having improved efficiency and brightness at reduced cost.

Embodiments of the present invention provide various lighting apparatus and methods of manufacture that result in devices with enhanced brightness and uniformity, improved stability and reliability, and lower manufacturing cost. A specific embodiment of the method is summarized in the simplified flow diagram in FIG. 5 and further illustrated in the simplified cross-sectional view diagrams in FIGS. 6A-6E.

Figure 5:
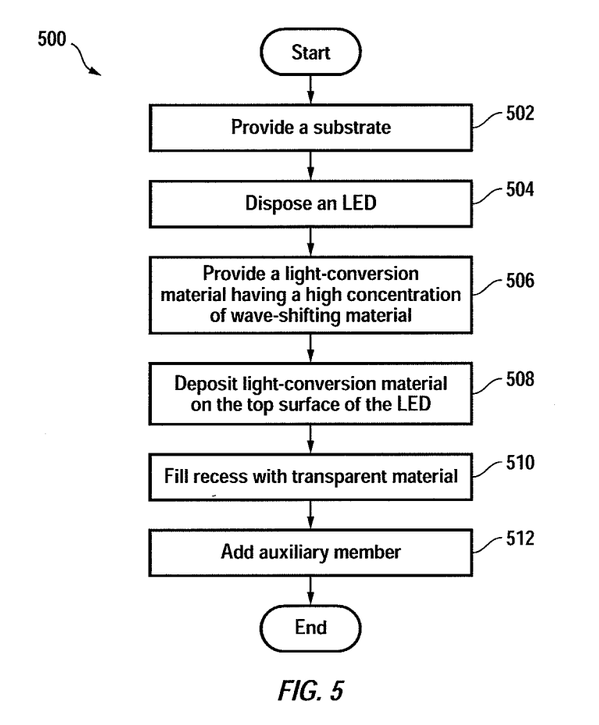
FIG. 5 is a simplified flow diagram illustrating a method for forming a lighting apparatus according to an embodiment of the present invention.
Figure 6A:
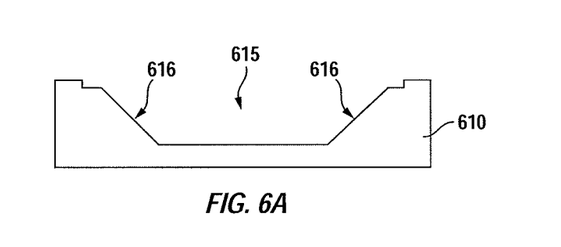
FIGS. 6A-6E are simplified view diagrams illustrating a method for making a light apparatus according to embodiments of the present invention.

At step 502 of process 500 of FIG. 5, a substrate is provided. Depending on the embodiment, the substrate can have various configurations. FIG. 6A shows an example of a substrate 610, which includes a recess 615 having tapered sidewalls 616. In this embodiment, recess 615 is shaped like a section of an inverted cone. The substrate and recess can be formed using known methods. For example, in some embodiments, the recess is defined into an existing material to form the sidewalls and the substrate, e.g., by etching the substrate material. In other embodiments, the substrate is a discrete layer, and the recess can be defined into one or more layers bonded above the substrate. In some embodiments, the recess has tapered sidewalls, as shown in FIG. 6A. In alternative embodiments, flat substrates can also be used. Other examples of substrates are described in U.S. patent application Ser. No. 11/036,559, filed on Jan. 13, 2005 and entitled "Light Emitting Device with a Thermal Insulating and Refractive Index Matching Material," which is commonly owned and incorporated by reference herein. In still other embodiments, a flat substrate can also be used.

Figure 6B:
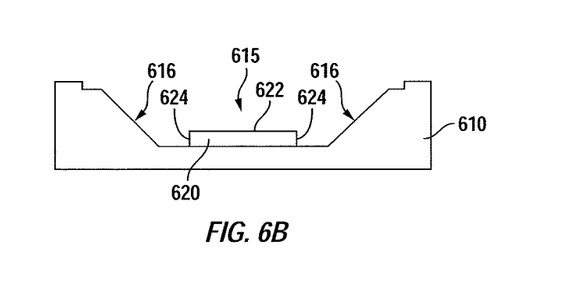

Referring to FIGS. 5 and 6B, at step 504, a light-emitting diode 620 is disposed in the recess 615. For example, LED 620 can be bonded or soldered to a bottom portion of the recess. The LED itself can be of conventional design and can be fabricated using known techniques. As shown in FIG. 6B, LED 620 has a top surface 622 oriented away from the substrate and a plurality of side surfaces 624. In embodiments using a flat substrate, the LED can be mounted on a top surface of the substrate.

In a specific embodiment, LED 620 is configured to emit light only from the top surface, and not from the side surfaces. Such a top-emitting LED die is well suited in lighting apparatus described herein, although LEDs that emit light from the sides as well as the top could also be used.

At step 506 of FIG. 5, a light-conversion material is prepared that includes a substantially transparent base material and a high concentration of wave-shifting material dispersed in the base material. As used herein, the concentration is a ratio of the weight of wave-shifting material to the weight of light-conversion material. The concentration can vary depending on the embodiments. For example, in some embodiments, the concentration of wave-shifting material can be 30%. In other embodiments, the concentration of wave-shifting material can be as high as 50% or 70%. In an embodiment, the wave-shifting material can be phosphor, and the base material can be silicone. In a specific example, the light-convention material includes 30% or more phosphor dispersed in a transparent base material such as silicone, resin, epoxy, or glass.

Currently available phosphors are often based on oxide or sulfide host lattices including certain rare earth ions.

Examples of phosphor materials include yttrium aluminum garnet (YAG) materials, terbium aluminum garnet (TAG) materials, ZnSeS+ materials, nitrides (e.g., $CaAlSiN_3$:Eu), and silicon aluminum oxynitride (SiAlON) materials (such as $\alpha$-SiAlON), etc. Other phosphor materials can also be used.

In other embodiments, other wave-shifting material can be substituted for the phosphor material. As used herein, a "wave-shifting" material includes any material that, when struck by light of a first wavelength, produces light of a second wavelength. Examples of wave-shifting materials include phosphor-containing materials, fluorescent materials, and the like. Such materials can be dispersed in a non-wave-shifting base material.

Figure 6C:
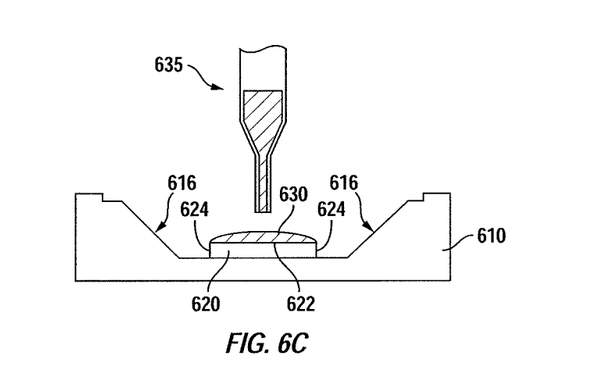

At step 508 of FIG. 5, a predetermined amount of the light-conversion material is deposited on the top surface of the light-emitting diode while maintaining the side surfaces substantially free of the light-conversion material. As shown in FIG. 6C, a syringe or needle 635 can be used to deposit a controlled amount of light-conversion material 630 on top surface 622 of LED 620, while side surfaces 624 remain substantially free of the light-conversion material. In a specific embodiment, a small drop of silicone containing a high-concentration (e.g., 30% or higher) of phosphor is coated on the top surface of the LED die.

In some embodiments of the present invention, large particles of phosphor are dispersed in the base material. In an example, the phosphor particles can have a diameter of 20 μm or larger. The high concentration and relatively large size of the phosphor particles produces a phosphor/silicone mixture with relatively high viscosity that is advantageously deposited using a device such as a syringe or needle. At a low pre-curing temperature, such as room temperature, the phosphor particles in the drop of phosphor/silicone material can settle to the top surface of the LED and form a substantially uniform layer of phosphor.

In FIG. 6C, syringe 635 is shown for illustrative purposes only. Any apparatus (e.g., nozzle, needle, etc.) that is adapted for depositing a small and measured amount of viscous material onto a target surface can be used. The deposition apparatus can also include multiple syringes for simultaneous deposition over multiple LEDs. Of course, there can be other modifications, variations, and alternatives.

Figure 6D:
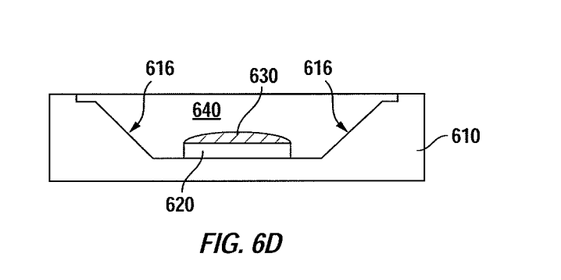

As shown in FIG. 6D (step 510), the rest of recess 615 can be filled with a transparent material 640, such as a resin, gel, or silicone. Any material that is substantially transparent to the light wavelengths of interest can be used. In some embodiments, transparent material 640 can also include a thermally insulating material. Various materials, including polymers, ceramics and glasses, can be used as the thermally insulating material. In one embodiment, the thermally insulating material can be a polyimide. In another embodiment, the thermally insulating material is a solvent-soluble thermoplastic polyimide. In an embodiment, the substrate, the light-emitting diode, and the light-conversion material are subjected to a curing process.

Figure 6E:
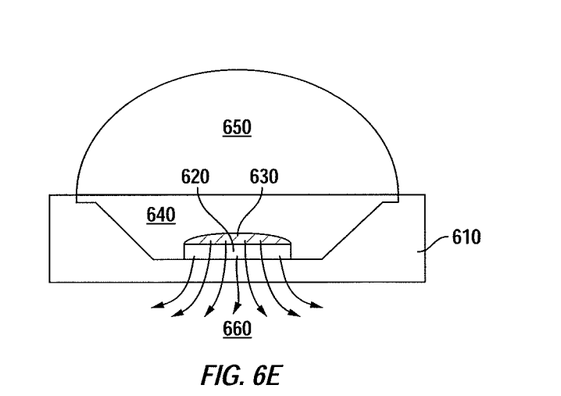

As shown in FIG. 6E (step 512), auxiliary member 650 is added over the structure of FIG. 6D. Auxiliary member 650 can be, for example, an optical lens for focusing the light emitted from LED 620. Auxiliary member 650 can also serve as a protective capping layer.

In FIG. 6E, light-conversion layer 630 overlies the top surface of LED 620, while the side surfaces of LED 620 are substantially free of the light-conversion layer. As described above, the light-conversion layer 630 includes a substantially transparent base material and a high concentration (e.g., 30% or more) of wave-shifting material dispersed in the base material. As also noted above, the phosphor particles in the phosphor/silicone layer can settle to a lower portion of the phosphor/silicone layer and form a substantially uniform layer of phosphor located close to the top surface of the LED chip. As a result, the temperature of the phosphor can be controlled by the cooling mechanism associated with the LED chip, such as a heat sink (not shown). The LED is a relatively good thermal conductor, so heat from the phosphor can be conducted through LED 620 to substrate 610 and/or to an external heat sink. This can prevent the phosphor from heating up to the point of deterioration during device operation. As a result, a thermally stable lighting apparatus is formed that can provide bright and uniform light.

It will also be appreciated that certain features have been omitted from FIG. 6E for clarity. For example, the sidewalls of recess (or cavity) 615 and substrate 610 can be part of a larger package that provides electrical connections (not shown) to LED 620. In some embodiments, recess 615 is defined into an existing material (e.g., by etching) to form sidewalls 616 that define recess 615. In other embodiments, substrate 610 is a discrete layer, and recess 615 can be created by bonding one or more layers above substrate 610. In still other embodiments, a flat substrate can also be used.

It will be appreciated that the device and manufacturing process described above are illustrative and that variations are possible. For example, curing steps can be added, e.g., after step 508 and/or 510. Moreover, various choices of LED and wave-shifting material can be used. In a specific embodiment for white light applications, a blue LED is used in conjunction with yellow phosphor to provide white light. In alternative embodiments of the invention, other combinations of colored light sources and phosphor materials can be used to form lighting devices of different colors. For example, complementary colors such as red and cyan or green and magenta can be used with the invention to form white light sources. Different types of phosphors or other wave-shifting materials can be included in the same light-conversion layer.

Furthermore, light sources outside the visible spectrum can also be used with the invention. The wavelengths of common LEDs are generally in a range of about 200 nm to 2000 nm, namely from the ultraviolet to the infrared. In some embodiments, a UV LED can be used in conjunction with a mixture of RGB phosphors either to form a white light source or to form a light source that produces light of one or more colors.

The above process provides a method for manufacturing a lighting apparatus according to an embodiment of the present invention. In a specific embodiment, the method uses a combination of steps including forming a light-conversion layer having a high density of wave-shifting material only on the top surface of an LED and not on the sidewalls of the LED. Merely as an example, a syringe or needle can be used in the deposition process. Other alternatives can also be provided where steps are added, one or more steps are removed, or one or more steps are provided in a different sequence without departing from the scope of the claims herein.

Figure 7A:
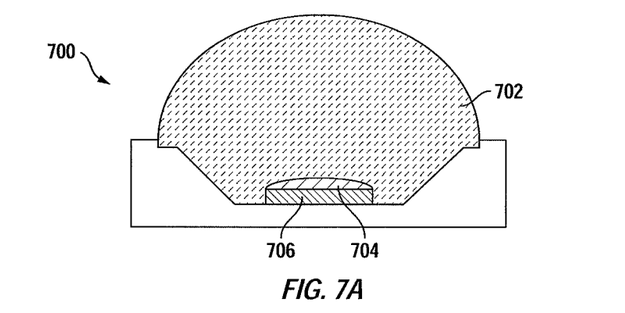
FIGS. 7A-7B are simplified cross-sectional diagrams illustrating alternative methods for making a light apparatus according to embodiments of the present invention.
Figure 7B:
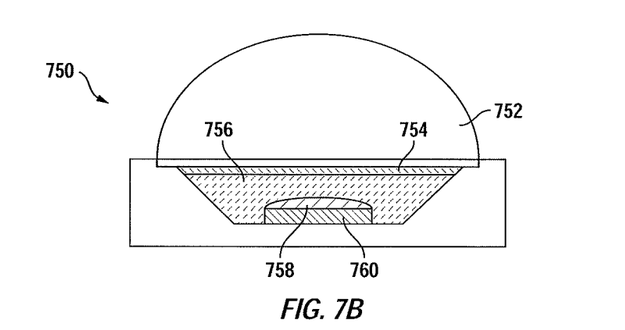

FIGS. 7A and 7B are simplified cross-sectional diagrams illustrating alternative methods for making a lighting apparatus according to embodiments of the present invention. In FIG. 7A, lighting apparatus 700 includes a dome-shaped silicone cap 702 overlying the light-conversion material 704 and LED 706. In FIG. 7B, lighting apparatus 750 has a glass lens 752 overlying a layer of material 754 which in turn overlies another layer of material 756. In an embodiment, both layers 754 and 756 can include silicone. The use of two layers, one or both of which can be very thin, can help to prevent cracking or delamination as the silicone cures. It will be understood that the number and thickness of layers overlying the light conversion material can be varied as desired. As shown in FIG. 7B, light-conversion layer 758 is positioned on top of LED 760.

Figure 8A:
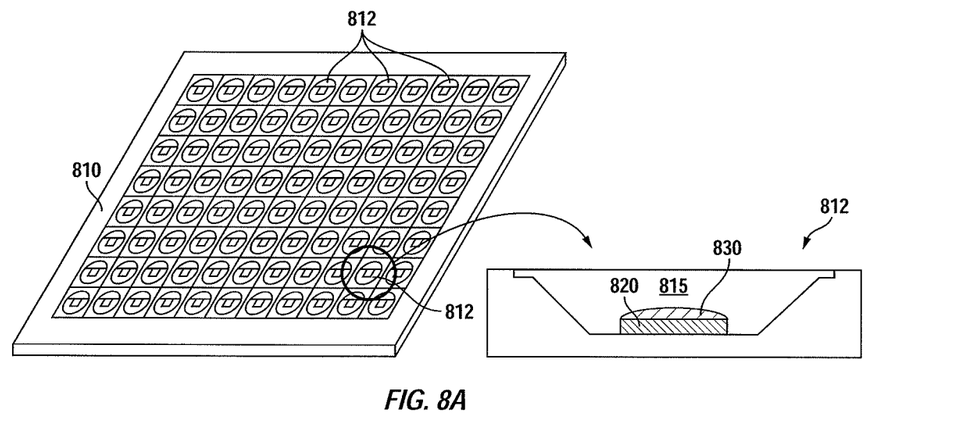
FIGS. 8A-8C are simplified diagrams illustrating another alternative method for making light apparatus on a large substrate according to embodiments of the present invention.

FIG. 8A is a simplified diagram illustrating another alternative method for making multiple light apparatus on a large substrate according to an embodiment of the present invention. In FIG. 8A, substrate 810 includes multiple LED cells 812. As shown in enlarged side view for a representative cell 812, each cell 812 is similar to the structure depicted in FIG. 6D. That is, each cell 812 has an LED 820 disposed in a recess 815 in the substrate and a light-conversion material 830 overlying LED 820. In one embodiment, the light-conversion material 830 can be disposed sequentially on the top surface of each LED 820 using a device such as a syringe. In another embodiment, light-conversion material 830 can be deposited simultaneously over at least two of the LEDs in parallel using multiple syringes or other devices. In these embodiments, the light-conversion material is deposited only on the top surface of the LED, while the side surfaces of each LED are maintained substantially free of the light-conversion material.

Figure 8B:
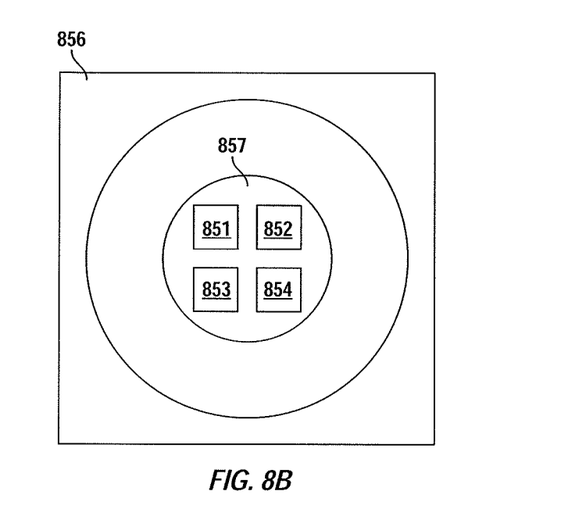
Figure 8C:
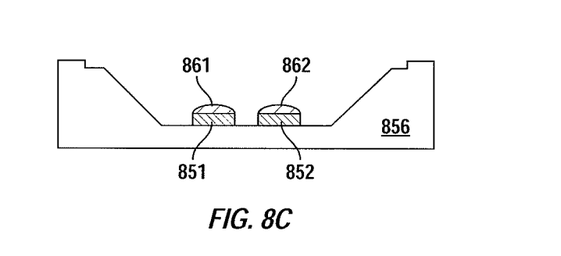

In another alternative embodiment of the present invention, multiple LED dice can be installed in a single recess in the substrate. FIG. 8B is a simplified top view of a lighting apparatus 850 having multiple LED dice in a single recess. As shown, four LED dice 851-854 are disposed in recess 857 of substrate 856. Depending on the embodiment, LED dice 851-854 can be the same type or different types (e.g., different wavelengths). FIG. 8C is a simplified cross-sectional view of lighting apparatus 850, in which each die, e.g., 851 or 852, receives a drop of light-converting material, 861 or 862. Each drop can have different base and/or wave-shifting material. For example, different phosphor-containing materials having a high concentration of phosphor, e.g., 30% or higher, can be used for each die. The phosphor-containing material is deposited on the top surface of each LED, and the side surfaces of the LED are substantially free of the phosphor-containing material. This deposition process may be performed using a syringe or a needle as described above, for each of the LEDs, either sequentially or in parallel.

In alternative embodiments, different combinations of colored light sources and phosphor materials can be used to form lighting devices of different colors. In one example, the LEDs can be configured to emit light of the same color. In another example, the LEDs can be configured to emit light of different colors. Different combinations of LEDs can be disposed in a single recess or in multiple recesses in a single substrate. In various embodiments, the deposition methods allow different wave-shifting materials to be used with individual LEDs. Using this method, the multiple LEDs in the same recess can be adapted to emit different colors. In a specific embodiment, a light apparatus includes an arrangement of 9 to 12 LED dice adapted to emit light of different colors in the same recess or on a single substrate. Alternatively, a batch manufacturing process can form LED cells for different colors in a large substrate such as one illustrated in FIG. 8A. Subsequently, the LED cells can be separated and packaged individually. This manufacturing flexibility cannot be realized using conventional methods.

Many other benefits can also be provided with embodiments of the present invention. For example, compared to conventional techniques, the deposition methods of the present invention provide more cost-effective use of the wave-shifting material, e.g., phosphor. As an example, using a syringe to deposit a drop of phosphor-containing material only on the top surface of an LED consumes as little as 0.1 mg or less of phosphor. In contrast, conventional methods such as slurry deposition or electro-plating can consume 10 times as much phosphor. Since phosphor materials are generally expensive, the cost of LED-based lighting apparatus can be substantially reduced by reducing the amount of phosphor.

Moreover, in embodiments of the present invention, larger phosphor particles (e.g., 25 μm diameter or larger) are used compared to conventional methods. The larger phosphor particles are more efficient in light conversion and can provide brighter light. Furthermore, as described above, the larger phosphor particles tend to settle to the bottom portion of the phosphor-containing material and be disposed close to the top surface the LED. As a result, more uniform light can be provided. In addition, tighter CIE color distribution and better color angle-distribution can also be obtained. Accordingly, better point light sources can be formed with the lighting apparatus provided by embodiments of the present invention.

Embodiments of the present invention also provide better temperature stability in the lighting apparatus. As a result, the LED can operate at higher driving current and provide enhanced brightness. We have performed various experiments to verify the thermal performance of the lighting apparatus embodiments of the invention. Results of these experiments are described below.

Figure 9A:
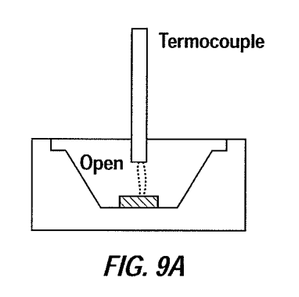
FIGS. 9A-9D are simplified diagrams illustrating various testing configurations of a lighting apparatus according to embodiments of the present invention.
Figure 9B:
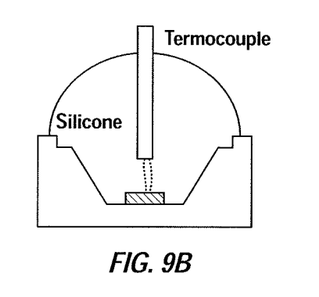
Figure 9C:
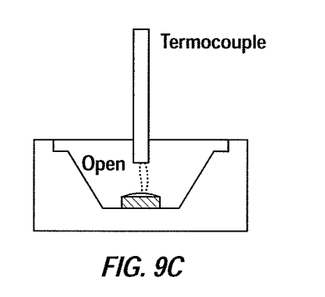

FIGS. 9A-9D illustrate various configurations of lighting apparatus that were tested for thermal performance. In each case, the LED was mounted on a substrate with a heat sink (not shown in the drawings) which was maintained at approximately 20° C. A thermocouple was used to measure device temperature as shown. The four device configurations are:

FIG. 9A LED chip;

FIG. 9B LED chip and silicone filler;

FIG. 9C LED chip and phosphor-containing material (YAG); and

Figure 9D:
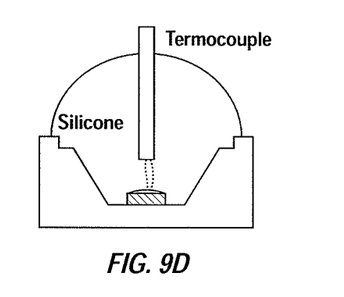

FIG. 9D LED chip, phosphor-containing material (YAG), and silicone filler.

Figure 10:
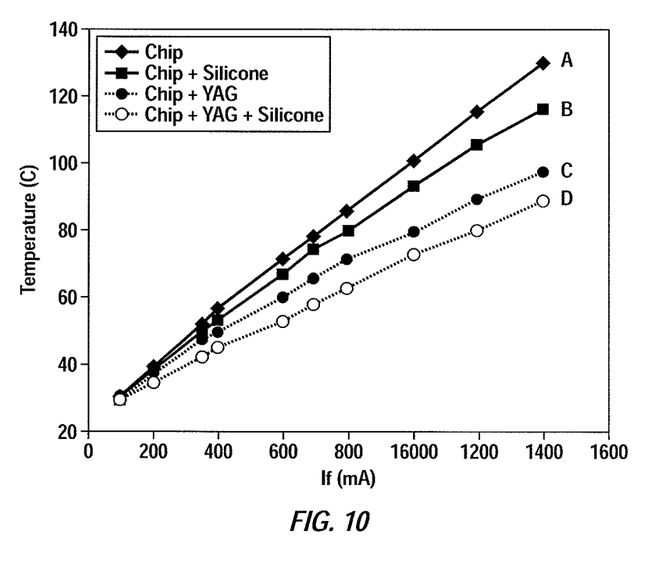
FIG. 10 is a graph showing measured temperature as a function of LED current corresponding to the configurations shown in FIGS. 9A-9D, respectively.

FIG. 10 is a graph showing measured temperature as a function of LED current (If). Lines A-D correspond to the configurations shown in FIGS. 9A-9D, respectively. As can be seen in FIG. 10, in all four configurations, the device temperature rises with increasing LED current. However, the temperature of the phosphor-containing material stays close to that of the LED chip. This is in contrast to the performance of a conventional device as shown in FIG. 2. Specifically, in FIG. 10, the temperature remains at 100° C. or lower for the phosphor-containing layer overlying the LED chip in curves C and D, whereas in FIG. 2 temperatures of approximately 200° C. occurred. Thus, depositing the phosphor-containing material on the top surface of the LED can help maintain the temperature of the phosphor in a lower range compared to conventional design.

Figure 11:
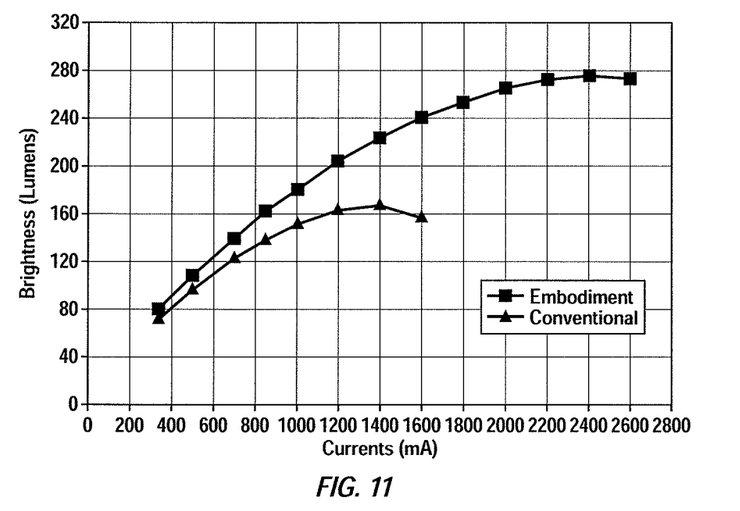
FIG. 11 is a simplified diagram illustrating brightness versus LED current in a conventional device and a lighting apparatus according to an embodiment of the present invention.

FIG. 11 is a simplified diagram comparing brightness versus LED current in a conventional device and a lighting apparatus according to an embodiment of the present invention. FIG. 11 clearly shows the saturation and degradation in brightness of a conventional device as LED current increases to about 1400 mA. In contrast, the lighting apparatus according to an embodiment of the invention does not show brightness saturation until the LED current reaches about 2400 mA. That is, the lighting apparatus provided by embodiments of the present invention can be operated at a much higher current for higher brightness. This is an important advantage in high power LED-based light apparatus.

Figure 12:
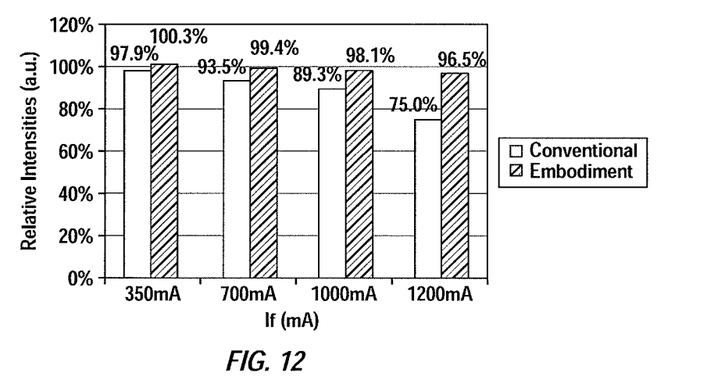
FIGS. 12 and 13 are simplified diagrams illustrating relative light intensity versus LED current in a conventional device and a lighting apparatus according to an embodiment of the present invention.
Figure 13:
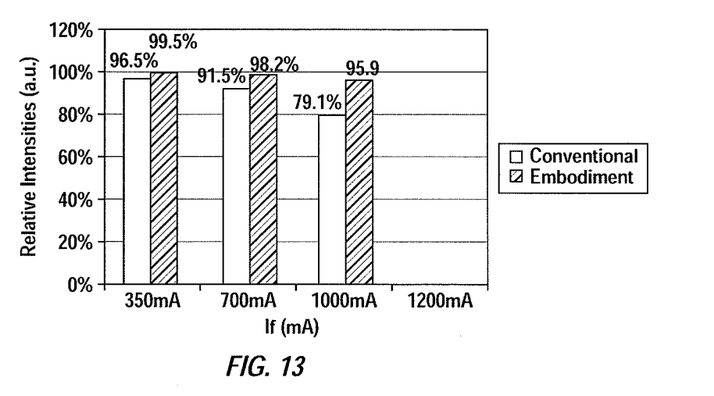

FIGS. 12 and 13 are simplified diagrams illustrating relative light intensity versus LED current in a conventional device and a lighting apparatus according to an embodiment of the present invention. FIGS. 12 and 13 show the drop-off of light intensity measured at three minutes after the turn-on of the device, that is, the percentage of the brightness after three minutes relative to the initial brightness. In FIG. 12, the heat sink is maintained at about 20° C., whereas in FIG. 13, the heat sink temperature is about 70° C. Both FIGS. 12 and 13 show that the conventional device exhibits much more light intensity drop-off at higher LED current (If) compared to a lighting apparatus according to an embodiment of the present invention. In a conventional device, as the phosphor heats up, its light-conversion efficiency can degrade resulting in less of the incident light being converted to the desired wavelength. In some conventional white light devices, the color can become more blue, as yellow light intensity decreases with heating of the phosphor at higher LED current. In embodiments of the present invention, the phosphor heats up less, and the loss of conversion efficiency is considerably reduced, resulting in more stable color and brightness. Accordingly, the lighting apparatus embodiments of the invention are better suited for high-current high-power LED-based lighting apparatus.

As shown in FIGS. 9-13, embodiments of the present invention provide improved light apparatus that can offer improved thermal properties and reliability. These improved thermal properties enable the lighting apparatus to operate at a higher LED current and provide enhanced brightness, as well as more stable color.

While certain embodiments of the invention have been illustrated and described, those skilled in the art with access to the present teachings will recognize that the invention is not limited to these embodiments only. Numerous modifications, changes, variations, substitutions, and equivalents will be apparent to those skilled in the art. Accordingly, it is to be understood that the invention is intended to cover all variations, modifications, and equivalents within the scope of the following claims.

What is claimed is:

1. A method for making a lighting apparatus, the method comprising:

providing a substrate;

disposing at least a first light-emitting diode and a second light-emitting diode overlying the substrate, each of the first and the second light-emitting diodes having a top surface oriented away from the substrate and a plurality of side surfaces;

providing a first phosphor-containing material having a phosphor concentration of at least 30% providing a second phosphor-containing material having a phosphor concentration of at least 30%;

depositing a first predetermined amount of the first phosphor-containing material on the top surface of the first light-emitting diode while maintaining the side surfaces substantially free of the phosphor-containing material; and depositing a second predetermined amount of the second phosphor-containing material on the top surface of the second light-emitting diode while maintaining the side surfaces substantially free of the phosphor-containing material, wherein the second predetermined amount is different from the first predetermined amount.

2. The method of claim 1 wherein the first light-emitting diode and the first phosphor-containing material are configured to produce light of a first color, and the second light-emitting diode and the second phosphor-containing material are configured to produce light of a second color that is different from the first color.

3. The method of claim 1 wherein the phosphor particles are characterized by diameters of 2 μm or larger.

4. The method of claim 1 wherein the phosphor-containing material is deposited using a syringe or a needle.

5. The method of claim 1 wherein the second phosphor-containing material is different from the first phosphor-containing material.

* * * * *